United States Patent
Kumata et al.

(10) Patent No.: US 7,863,062 B2
(45) Date of Patent: Jan. 4, 2011

(54) SEMICONDUCTOR DEVICE WITH A SHIELDING SECTION TO PREVENT CONDENSATION AND OPTICAL DEVICE MODULE HAVING THE SEMICONDUCTOR DEVICE

(75) Inventors: Kiyoshi Kumata, Kyotanabe (JP); Kazuya Fujita, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 279 days.

(21) Appl. No.: 12/156,192

(22) Filed: May 30, 2008

(65) Prior Publication Data

US 2008/0296715 A1   Dec. 4, 2008

(30) Foreign Application Priority Data

May 31, 2007   (JP) .............................. 2007-146222

(51) Int. Cl.
*H01L 21/00* (2006.01)
*H01L 33/00* (2006.01)

(52) U.S. Cl. .............................. 438/25; 438/27; 438/29; 438/60; 438/64; 257/98; 257/99; 257/432; 257/433; 257/E27.129

(58) Field of Classification Search ........................ None
See application file for complete search history.

(56) References Cited

U.S. PATENT DOCUMENTS

| | | | |
|---|---|---|---|
| 7,456,483 B2 * | 11/2008 | Tsukamoto et al. .......... 257/433 |
| 2002/0105591 A1 | 8/2002 | Nakamura et al. |
| 2004/0002179 A1 | 1/2004 | Barton et al. |
| 2004/0036069 A1 | 2/2004 | Barton et al. |
| 2004/0164981 A1 | 8/2004 | Fujita et al. |
| 2005/0247992 A1 | 11/2005 | Tsukamoto et al. |
| 2006/0044450 A1 | 3/2006 | Wolterink et al. |
| 2006/0237829 A1 | 10/2006 | Hosomi |
| 2007/0019101 A1 | 1/2007 | Minamio et al. |
| 2007/0030334 A1 | 2/2007 | Nishizawa |
| 2007/0267712 A1 | 11/2007 | Fujita et al. |
| 2007/0275505 A1 | 11/2007 | Wolterink et al. |

FOREIGN PATENT DOCUMENTS

| | | |
|---|---|---|
| JP | 04-239759 | 8/1992 |
| JP | 11-103038 | 4/1999 |
| JP | 2002-231918 | 8/2002 |
| JP | 2004-031939 | 1/2004 |

(Continued)

OTHER PUBLICATIONS

U.S. Appl. No. 12/155,042, filed on May 29, 2008.

*Primary Examiner*—Alonzo Chambliss
(74) *Attorney, Agent, or Firm*—Edwards Angell Palmer & Dodge LLP; David G. Conlin; Steven M. Jensen

(57) ABSTRACT

In a solid-state imaging device 1 in which a hollow section 9 is formed between a solid-state imaging element 2 and a covering section 4 and an air path 7 extending from the hollow section 9 to the outside is formed in an adhesive section 5, a shielding section 11 for shielding the air path 7 is formed on the air path 7 so as to be positioned on a portion exposed from the covering section 4. This makes it possible to reduce noises occurring in a signal processing section of a semiconductor element while preventing condensation in the covering section for covering the semiconductor element.

15 Claims, 10 Drawing Sheets

FOREIGN PATENT DOCUMENTS

| | | |
|---|---|---|
| JP | 2004-146946 | 5/2004 |
| JP | 2005-020687 | 1/2005 |
| JP | 2005-322809 | 11/2005 |
| JP | 2006-310859 | 11/2006 |
| JP | 2007-53337 | 3/2007 |
| JP | 2007-115833 | 5/2007 |
| JP | 2008-011144 | 1/2008 |
| WO | WO-2004/027880 | 4/2004 |

* cited by examiner

US 7,863,062 B2

SEMICONDUCTOR DEVICE WITH A SHIELDING SECTION TO PREVENT CONDENSATION AND OPTICAL DEVICE MODULE HAVING THE SEMICONDUCTOR DEVICE

This Nonprovisional application claims priority under 35 U.S.C. §119(a) on Patent Application No. 146222/2007 filed in Japan on May 31, 2007, the entire contents of which are hereby incorporated by reference.

FIELD OF THE INVENTION

The present invention relates to (i) a semiconductor device which can more effectively prevent water and foreign substance from entering a semiconductor element via an air path and (ii) an optical device module having the semiconductor device.

BACKGROUND OF THE INVENTION

A conventional photo acceptance semiconductor device, such as a CCD (Charge Coupled Device) image sensor and a CMOS (Complementary Metal Oxide Semiconductor) image sensor, for converting an optical signal into an electric signal has a semiconductor element or the like packaged and sealed in a hollow package made of ceramics, plastics or the like, in order to prevent moisture, contaminant and the like from entering the semiconductor element from the outside.

FIG. 12 is a sectional view schematically illustrating a structure of a solid-state imaging device as an example of a conventional photo acceptance semiconductor device. The solid-state imaging device 100 includes: a circuit substrate 101 serving as a base; a solid-state imaging element (photo acceptance element) 102; and a covering body 104 attached via an adhesive section 103 on the circuit substrate 101 so as to cover the solid-state imaging element 102. The solid-state imaging device 100 constitutes a hollow package having a hollow section in the covering body 104. The solid-state imaging element 102 is disposed in the covering body 104. In the covering body 104, a transparent covering section 105 is disposed opposite to the solid-state imaging element 102. The transparent covering section 105 is attached to the covering body 104 via an adhesive section 106. Between the transparent covering section 105 and the circuit substrate 101 (solid-state imaging element 102), a space S is formed. The circuit substrate 101 is made of ceramics, glass epoxy, or the like, and the circuit substrate 101 and the solid-state imaging element 102 are electrically connected to each other via a bonding wire 107. The covering body 104 supports a lens barrel 108 positioned at an internal center of the covering body 104, and the lens barrel 108 supports lenses 109 positioned inside the lens barrel 108.

In the solid-state imaging device 100 of FIG. 12, the covering body 104 is disposed above the circuit substrate 101 via the adhesive section 103, and the solid-state imaging element 102 is stored in the covering body 104. Thus, it is difficult to make the solid-state imaging device 100 smaller.

Patent Document 1 discloses a solid-state imaging device which can be made shorter. FIG. 13 is a sectional view of the solid-state imaging device of Patent Document 1. The solid-state imaging device 200 is arranged so that a transparent covering section 205 is bonded to a solid-state imaging element 202 via an adhesive section 203. Further, the solid-state imaging element 202 and the transparent covering section 205 are molded with a poromeric mold resin 207 so that a surface of the covering section 205 is exposed. Further, a lens barrel 208 supporting a lens 206 is bonded to the mold resin 207 via an adhesive section (not shown). In the solid-state imaging device 200, the solid-state imaging element 202 does not have to be stored in the lens barrel (covering body) 208, so that the solid-state imaging device 200 can be made smaller than the solid-state imaging device 100.

In the solid-state imaging device 200 of FIG. 13, a hollow section 209 is formed between the solid-state imaging element 202 and the transparent covering section 205. The hollow section 209 is a tightly closed space, so that condensation may occur on an internal face of the covering section 205.

Patent Document 2 discloses a solid-state imaging device having an air path as measures for preventing occurrence of condensation. FIG. 14 is a plan view (top view) illustrating a partial arrangement of the solid-state imaging device 300 of Patent Document 2. FIG. 15 is a cross sectional view taken along C-C of the solid-state imaging device 300 of FIG. 14. As illustrated in FIG. 15, the solid-stated imaging device 300 of Patent Document 2 is arranged so that a hollow section 309 is formed between a solid-state imaging element 302 and a transparent covering section 305, so that condensation may occur on the internal face of the covering section 305. Thus, as measures for preventing occurrence of condensation, an air path is formed in the adhesive section 303 via which the solid-state imaging element 302 and the transparent covering section 305 are bonded to each other.

Specifically, as illustrated in FIG. 14, the solid-state imaging device 300 is arranged so that an air path 311 extending from the hollow section 310 to the outside is formed. The adhesive section 309 occupies a larger area than the transparent covering section 305, and the air path 311 is formed in the adhesive section 303 so as to be positioned outside the covering section 305. This air path 311 allows a surface of the solid-state imaging element 302 to be under the same condition as ambient air, so that it is possible to prevent occurrence of condensation in the covering section 305. Further, the air path 311 has a complicate shape, thereby preventing water from entering the hollow section 310 via the air path 311.

While, Patent Document 3 discloses a camera device (solid-state imaging device) arranged so that two lens substrates are provided, in a stacking manner with an interval therebetween, above a substrate having a solid-state imaging element therein.

However, the arrangement of Patent Document 2 raises such problem that water or water and foreign substance enter via the air path 311 at the time of manufacturing (particularly, at the time of the dicing step) though it is possible to prevent occurrence of condensation with use of the air path 311.

While, in the arrangement of Patent Document 3, an interval (hollow section) is formed between the two lens substrates, so that condensation may occur. However, the arrangement of Patent Document 3 has no preparation for preventing condensation.

[Patent Document 1]
Japanese Unexamined Patent Publication Tokukai 2004-296453 (Publication date: Oct. 21, 2004)
[Patent Document 2]
Japanese Unexamined Patent Publication Tokukai 2005-322809 (Publication date: Nov. 17, 2005)
[Patent Document 3]
Japanese Translation of PCT International Application Tokuhyo 2005-539276 (Publication date: Dec. 22, 2005)

SUMMARY OF THE INVENTION

The present invention was made in view of the foregoing problems, and an object of the present invention is to provide (i) a semiconductor device which can effectively prevent water or foreign substance from entering via an air path and (ii) an optical device module having the semiconductor device.

That is, in order to achieve the foregoing object, a semiconductor device of the present invention includes: a semiconductor element; a covering section for covering the semiconductor element; a first adhesive section for bonding the semiconductor element and the covering section; a first hollow section formed between the semiconductor element and the covering section; and a first air path provided in the first adhesive section so as to extend from the first hollow section to the outside, wherein the first air path has a shielding section which is provided on a portion exposed from the covering section so as to shield the first air path.

According to the arrangement, the first air path is formed so as to extend from the first hollow section to the outside, so that it is possible to prevent occurrence of condensation in the covering section. Moreover, the first air path is shielded by the shielding section provided on the portion exposed from the covering section. Thus, the shielding section can effectively prevent water and foreign substance from entering the first hollow section via the first air path.

In order to achieve the foregoing object, an optical device module of the present invention includes: the semiconductor device of the present invention and a lens unit for guiding external light to the semiconductor element, wherein: the covering section is transparent, and the semiconductor element is a solid-state imaging element having an effective pixel region in which a plurality of photo acceptance elements for converting light transmitted through the covering section into an electric signal are disposed, and the first adhesive section is formed so as not to be positioned on the effective pixel region.

According to the arrangement, the solid-state imaging device which is one embodiment of the semiconductor device of the present invention is internally provided, so that it is possible to realize an optical device module which can effectively prevent water or foreign substance from entering via the first air path.

In order to achieve the foregoing object, an optical device module of the present invention includes the semiconductor device and a lens unit, wherein: the covering section is transparent, and the semiconductor element is a solid-state imaging element having an effective pixel region in which a plurality of photo acceptance elements for converting light transmitted through the covering section into an electric signal are disposed, and the first adhesive section is formed so as not to be positioned on the effective pixel region, and the lens unit guides external light to the semiconductor element.

According to the arrangement, the solid-state imaging device which is one embodiment of the semiconductor device of the present invention is internally provided, so that it is possible to realize an optical device module which can effectively prevent water or foreign substance from entering via the first air path.

Additional objects, features, and strengths of the present invention will be made clear by the description below. Further, the advantages of the present invention will be evident from the following explanation in reference to the drawings.

DESCRIPTION OF THE EMBODIMENTS

The following describes an embodiment of the present invention with reference to the attached drawings. Note that, the following describes a case where the semiconductor device of the present invention is a solid-state imaging device including a solid-state imaging element as a semiconductor element.

Embodiment 1

Figure 1:
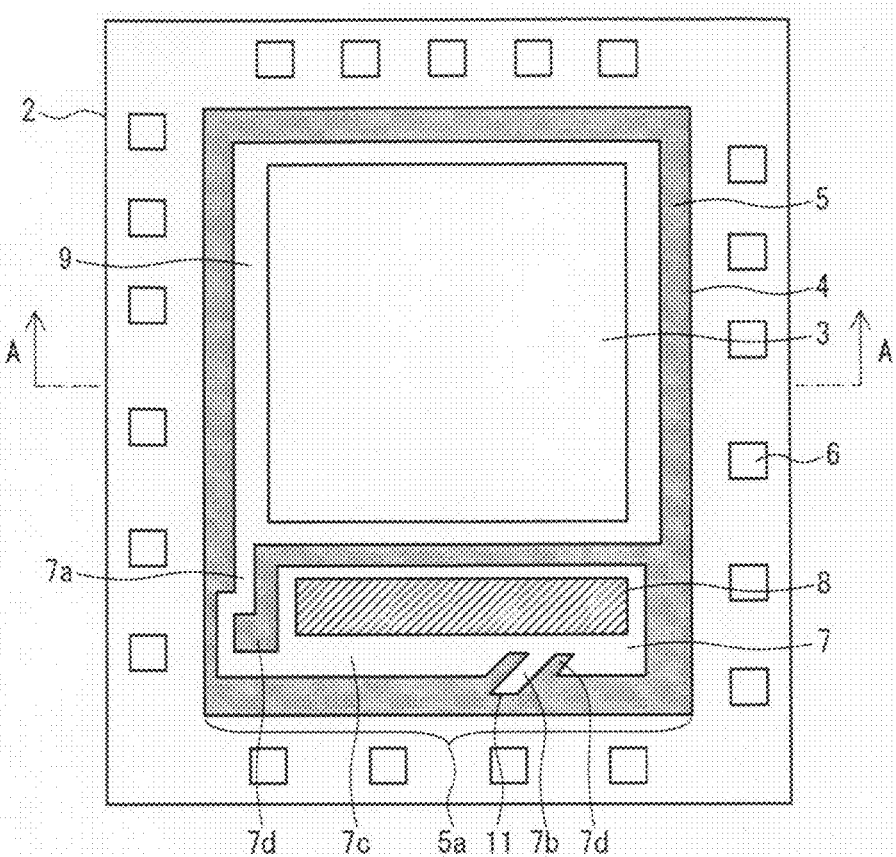
FIG. 1 is a plan view schematically illustrating an arrangement of a solid-state imaging device of the present invention.
Figure 2:
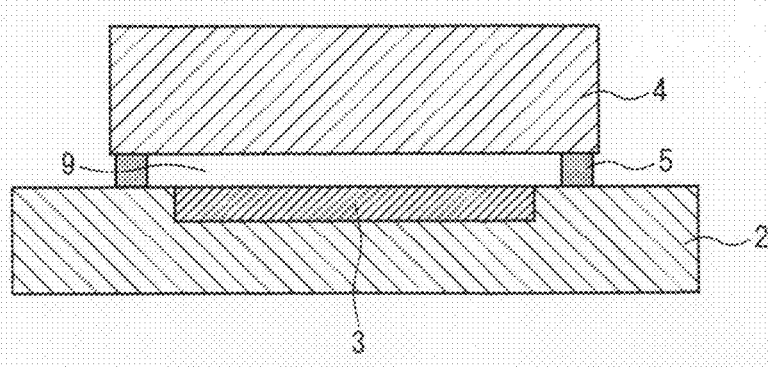
FIG. 2 is a cross sectional view taken along A-A of the solid-state imaging device of FIG. 1.

Each of FIG. 1 and FIG. 2 schematically illustrates a solid-state imaging device (semiconductor device) 1 according to Embodiment 1 of the present invention. FIG. 1 is a plan view (top view) of the solid-state imaging device 1 whose main surface (one side) is seen from the above. FIG. 2 is a cross sectional view taken along A-A of the solid-state imaging device 1 of FIG. 1.

The solid-state imaging device 1 includes, as main components, a solid-state imaging element (semiconductor element) 2, a covering section 4, an adhesive section 5 (first adhesive section) for bonding the solid-state imaging element 2 and the covering section 4, and a signal processing section 8 for processing a signal of the solid-state imaging element 2.

The solid-state imaging element 2 is a semiconductor substrate (e.g., a silicon monocrystal substrate) having a semiconductor circuit thereon and having a square shape in a plan view. Examples of the solid-state imaging element 2 include a CCD (charge-coupled device) image sensor, a CMOS (complementary metal-oxide semiconductor) image sensor, and a VMIS image sensor (Threshold Voltage Modulation Image Sensor). The solid-state imaging element 2 has an effective pixel region 3 in which a plurality of photo acceptance elements (pixels) are disposed in a matrix manner. The effective pixel region 3 is formed on a central portion of a main face (surface) of the solid-state imaging element 2 so as to have a square shape in a plan view. Further, the photo acceptance elements convert a subject image (light transmitted through the covering section 4) formed on the effective pixel region 3 into an electric signal.

The covering section 4 is made of transparent material (e.g., glass) and is disposed opposite to the solid-state imaging element 2 so as to cover at least the effective pixel region 3. Note that, the solid-state imaging element 2 (effective pixel region 3) and the covering section 4 are not in contact with each other. Further, a size of the covering section 4 is smaller than the solid-state imaging element 2. In this manner, the covering section 4 is disposed opposite to the main face of the solid-state imaging element 2 so as to cover at least the effective pixel region, so that it is possible to protect the effective pixel region 3 from the outside. That is, it is possible to protect the effective pixel region 3 from external moisture, dusts (contaminants, parings) and the like. Note that, an infrared reflection layer may be formed on a rear face of the covering section 4 (on a face opposite to the solid-state imaging element 2). Further, a reflection preventing layer may be formed on a surface of the covering section 4 so as to prevent ghost.

The adhesive section 5 is formed around the effective pixel region 3 so as to have a cyclic-square shape in a plan view so that an optical path between the effective pixel region 3 and the covering section 4 is not shielded (so that there is no trouble in imaging). As illustrated in FIG. 2, the adhesive section 5 bonds the effective pixel region 3 and the covering section 4 so that the hollow section (space: first hollow section) 9 is formed between the effective pixel region 3 and the covering section 4. That is, the covering section 4 and the adhesive section 5 constitute a covering body which covers the solid-state imaging element 2. In the adhesive section 5, an air path 7 extending from the hollow section 9 to the outside is formed as described below. Further, the air path 7 has a shielding section 11 (described later) which is provided on a portion exposed from the covering section 4 so as to shield the air path 7.

In this manner, the adhesive section 5 is formed on a region which does not shield an optical path between the covering section 4 and the effective pixel region 3. Thus, it is possible to form the adhesive section 5 and the air path 7 without dropping photo acceptance efficiency in an optical signal.

Note that, it is preferable that the adhesive section 5 includes photosensitive adhesive such as UV cure resin for example. This makes it possible to form the adhesive section 5 whose air path 7 is highly accurately formed and highly accurately positioned in accordance with photolithography. Moreover, it is possible to form at once a large number of adhesive sections 5 highly accurately patterned.

The signal processing section 8 is a signal processing circuit section for processing a signal of the solid-state imaging element 2. Specifically, the signal processing section 8 controls operations of the solid-state imaging element 2 and functions also as a control section (image processing device) for suitably processing a signal outputted from the solid-state imaging element 2 so as to generate a necessary signal. For example, the signal processing section 8 includes electronic components such as: an amplification circuit section (analog signal circuit section) for amplifying an electric signal obtained by conversion with the photo acceptance elements of the effective pixel region 3 so as to output the electric signal as an analog signal; an analog/digital conversion processing circuit section for converting the analog signal into a digital signal; a DSP (digital signal processor) for controlling operations of the solid-state imaging element 2; a CPU for performing various kinds of operations in accordance with a program; a ROM for storing the program therein; and a RAM for storing data and the like of respective processing steps. Further, the solid-state imaging device 1 is entirely controlled by these electronic components.

In the present embodiment, the signal processing section 8 is disposed adjacent to the effective pixel region 3, the adhesive section 5 is not formed on a region where the signal processing section 8 is formed. That is, the adhesive section 5 is formed so as not to be positioned on the signal processing section 8. As a result, the signal processing section 8 is exposed from the adhesive section 5.

Note that, in the solid-state imaging device 1, a plurality of bonding pads 6 each of which serves as a terminal for connecting the solid-state imaging element 2 and an external circuit (not shown) are disposed between the adhesive section 5 (covering section 4) and a peripheral end (chip end) of the main face of the solid-state imaging element 2. The bonding pads 6 are not covered by the covering section 4. Thus, a plane size of the covering section 4 is smaller than a plane size of the solid-state imaging element 2, thereby making the solid-state imaging element 2 smaller.

The solid-state imaging device 1 incorporates external light through the covering section 4 and the photo acceptance elements disposed on the effective pixel region 3 receive light indicative of an image. In the solid-state imaging device 1, the hollow section 9 is formed between the effective pixel region 3 and the covering section 4, so that external light having been transmitted through the covering section 4 is incident on the effective pixel region 3 without any modification, so that no light loss occurs in the optical path.

In the solid-state imaging device 1, the hollow section 9 is formed between the solid-state imaging element 2 and the transparent covering section 4 as described above, so that condensation may occur on the internal face of the covering section 4. Thus, the air path 7 is formed in the adhesive section 5 for bonding the solid-state imaging element 2 and the transparent covering section 4 as means for preventing occurrence of condensation. The air path 7 is formed in the adhesive section 5 so as to extend from the hollow section 9 to the outside.

Figure 14:
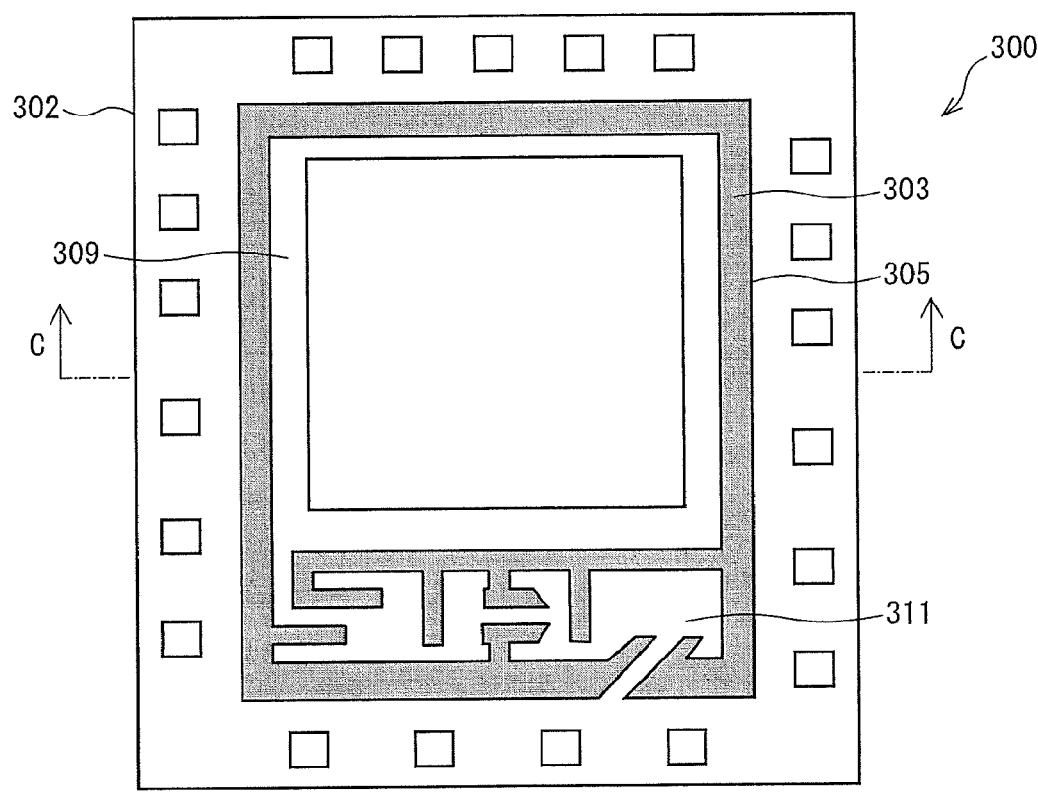
FIG. 14 is a plan view illustrating essential portions of a solid-state imaging device of Patent Document 2.
Figure 15:
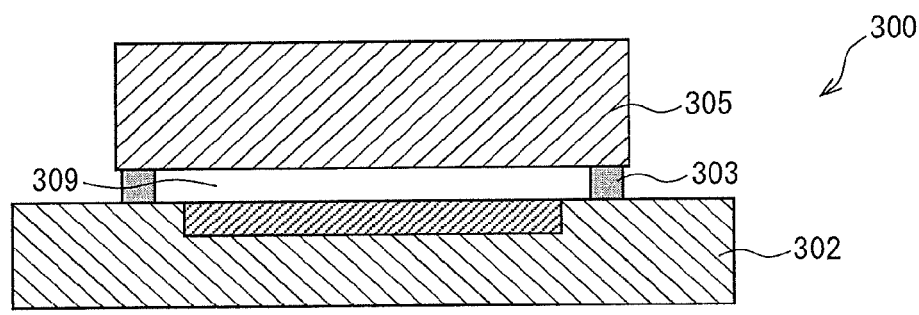
FIG. 15 is a cross sectional view taken along C-C of the solid-state imaging device of FIG. 14.

Also the solid-state imaging device 300 of Patent Document 2 (see FIG. 14) includes an air path 311. However, it is impossible to sufficiently prevent water or water and foreign substance from entering via the air path 311.

Thus, in the solid-state imaging device 1, the shielding section 11 for shielding the air path 7 is provided on the air path 7 so as to be positioned on a portion exposed from the covering section 4.

Herein, the air path 7 is detailed as follows. The air path 7 extends from the hollow section 9 to the outside of the solid-state imaging device 1 and prevents occurrence of condensation inside the covering section 4. A shape of the air path 7 is not particularly limited and can be arbitrarily set in accordance with a shape of the adhesive section 5.

In the solid-state imaging device 1 of the present embodiment, the air path 7 includes: a first opening end 7a extending to the hollow section 9; a second opening end 7b extending to the outside; and a catcher (first catcher) 7c which is provided between the first opening end 7a and the second opening end 7b so as to catch water. In this manner, the first opening end 7a of the air path 7 is provided on the adhesive section 5 so as to be positioned on the side of the hollow section 9, and the second opening end 7b of the air path 7 is provided on the adhesive section 5 so as to be positioned outside, and the catcher 7c for catching water existing in the air path 7 is provided between the first opening end 7a and the second opening end 7b which are provided on the air path 7. Thus, even if water or water and a foreign substance enter from the outside via the second opening end 7b in any production step carried out after a dicing step, the catcher 7c can catch (keep) the water and the foreign substance.

Further, in the solid-state imaging device 1, the second opening end 7b does not completely pierce the adhesive section 5. As a result, it is possible to more effectively prevent water and foreign substance from entering the hollow section 9 than a case where the second opening end 7b pierces the adhesive section 5.

In addition to the air path 7, the shielding section 11 for shielding the air path 7 is provided on the air path 7 so as to be positioned on a portion exposed from the covering section 4. In other words, the opening end positioned on the outside of the air path 7 does not pierce to a side face (end face) of the adhesive section 5. That is, the air path 7 is shielded at the outside of the covering section 4. Thus, the shielding section 11 can effectively prevent water and foreign substance from entering the hollow section 9 via the air path 7. That is, the shielding section 11 functions as a dam formed on the air path 7.

Figure 6:
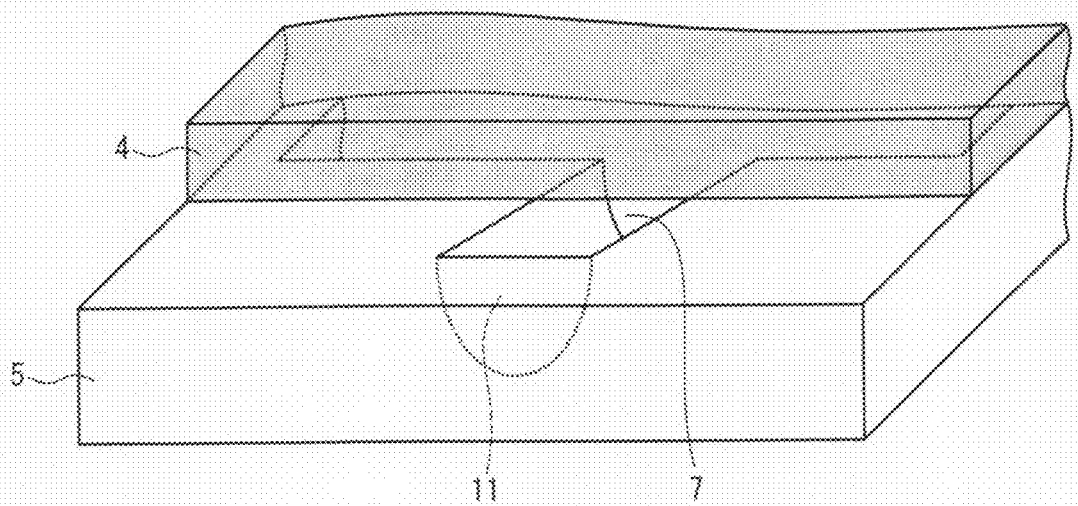
FIG. 6 is a perspective view schematically illustrating an arrangement of a shielding section formed on an air path of a solid-state imaging device of the present invention.

FIG. 6 is a perspective view obtained by enlarging a vicinity of the shielding section 11 of FIG. 1. As illustrated in FIG. 6, the solid-state imaging device 1 is arranged so that the shielding section 11 is formed on the adhesive section 5 so as to be positioned on its side face via which water and foreign substance are most likely to enter. Thus, it is possible to more effectively prevent water and foreign substance from entering the hollow section 9 via the air path 7. Further, the solid-state imaging device 1 is arranged so that the shielding section 11 is a part of the adhesive section 5, so that it is possible to form the shielding section 11 at the same time as formation of the adhesive section 5.

Figure 7:
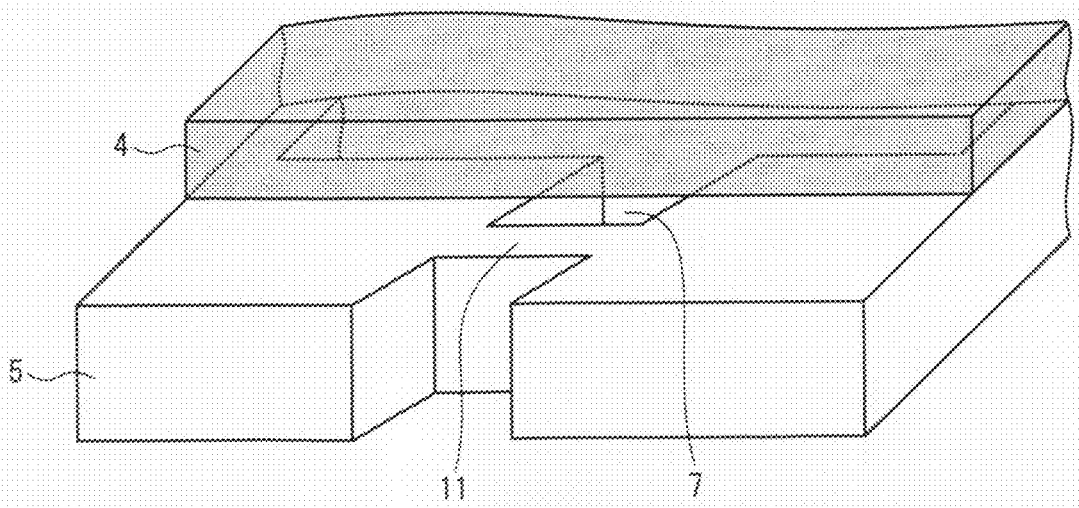
FIG. 7 is a perspective view schematically illustrating an arrangement of another shielding section of a solid-state imaging device of the present invention.

The arrangement of the shielding section 11 is not limited to the arrangement in which the adhesive section 11 is formed on the side face of the adhesive section 5. FIG. 7 is a perspective view illustrating an arrangement of another shielding section 11. As illustrated in FIG. 7, the arrangement of the shielding section 11 is not particularly limited as long as the shielding section 11 is formed on the air path 7 exposed from the covering section 4.

Further, the depth of the air path 7 is not particularly limited. The depth of the air path 7 may be smaller than the thickness of the adhesive section 5 as illustrated in FIG. 6, or the depth of the air path 7 may be equal to the thickness of the adhesive section 5 as illustrated in FIG. 7. In other words, the adhesive section 5 may exist on the bottom of the air path 7 or it may be so arranged that the adhesive section 5 does not exist on the bottom of the air path 7. However, according to the arrangement of FIG. 7, the adhesive section 5 and the air path 7 can be formed at the same time by patterning for example. Thus, it is preferable that the depth of the air path 7 is equal to the thickness of the adhesive section 5.

Incidentally, an air path 311 is formed also on the solid-state imaging device 300 (see FIG. 14) of Patent Document 2. However, in order to more effectively prevent water and foreign substance from entering the hollow section 309, the shape of the air path 311 is complicate. Moreover, the present inventors found that: When converting an optical signal received by the solid-state imaging element into an electric signal, noises of unknown origin occur, and the noises result in a strip-shaped contrast difference on the screen. The technique of Patent Document 2 has no preparation for preventing noises occurring in the solid-state imaging device 300.

The present inventors diligently studied a cause of noises occurring in the solid-state imaging device 300 of Patent Document 2. As a result, it was found that the noises are caused by a condition under which the signal processing section is partially covered by the adhesive section. That is, it was found that: the adhesive section has a portion which covers the signal processing section and a portion which does not cover the signal processing section, so that a dielectric constant of the adhesive section influences processing of the signal processing section, which results in noises on the screen.

Thus, in the solid-state imaging device 1 of the present embodiment, the adhesive section 5 is formed so as not to be positioned on the signal processing section 8. That is, the adhesive section 5 is formed so as not to entirely cover the signal processing section 8. As a result, the adhesive section 5 does not influence the signal processing of the signal processing section 8. This makes it possible to reduce noises occurring in the signal processing section 8. Therefore, it is possible to prevent a dielectric constant of the adhesive section 5 from influencing the signal processing section 8, thereby preventing occurrence of noises on the screen.

In the solid-state imaging device 1, the noises greatly influence the analog signal circuit section of the signal processing section 8, particularly, the amplification circuit section which amplifies an electric signal obtained by conversion with the photo acceptance elements. Thus, in the solid-state imaging device 1, it is preferable to form the adhesive section 5 so that the adhesive section 5 is not positioned on the analog signal circuit section, particularly, not positioned on the amplification circuit section. If the adhesive section 5 is formed so as not to be positioned on the signal processing section 8 in this manner, it is possible to reduce noises of the analog signal circuit section and the amplification circuit section each of which is likely to generate noises. Note that, the adhesive section 5 is formed so as not to be positioned on at least the analog signal circuit section and the amplification circuit section each of which is particularly likely to be influenced by noises.

Further, in the solid-state imaging device 1, each of the first opening end 7a and the second opening end 7b has a protruding wall 7d which protrudes toward the catcher 7c. Thus, the second opening end 7b extends so that the increment corresponds to the length of the protruding wall 7d. This structure hardly allows water to enter the hollow section 9 from the outside via the second opening end 7b in the dicing step. Further, even in case where water enters the catcher 7c, it is possible to prevent water caught by the catcher 7c from reaching the first opening end 7a along an internal wall of the catcher 7c, so that water hardly enters from the catcher 7c to the hollow section 9 via the first opening end 7a.

Further, in the solid-state imaging device 1, the adhesive section 5 has a cyclic-square shape in a plan view, and the air path 7 is formed along a side 5a of the adhesive section 5. If the adhesive section 5 has a cyclic-square shape in this manner, it is possible to easily design a layout of the adhesive section 5. Moreover, the air path 7 is formed along the side 5a of the adhesive section 5, so that a region in which the air path 7 is to be formed (or the catcher 7c) can be easily reserved. Further, if the air path 7 is formed along only the side 5a of the adhesive section 5, it is possible to make the solid-state imaging device 1 smaller.

Figure 3:
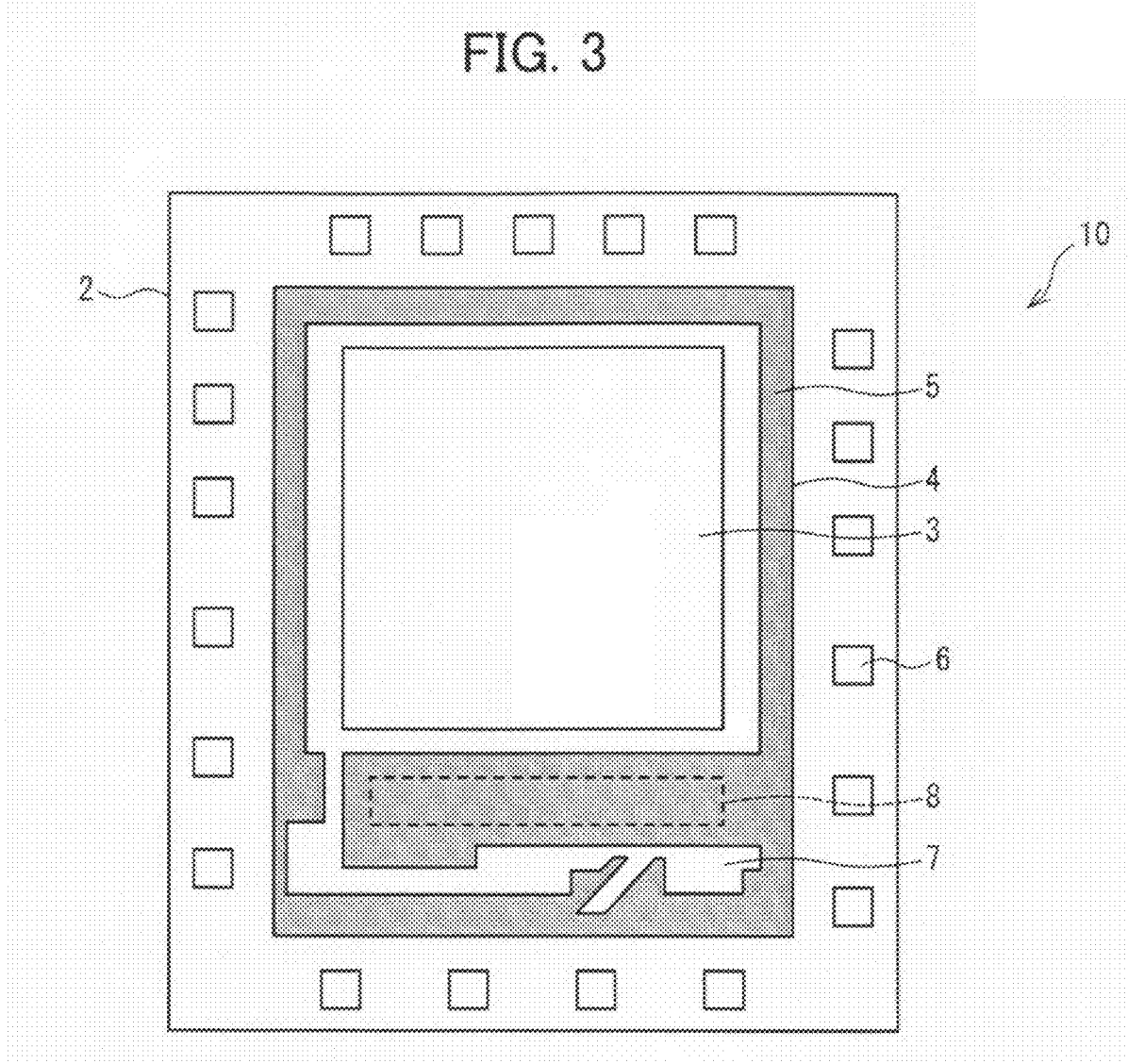
FIG. 3 is a plan view schematically illustrating another solid-state imaging device of the present invention.

Note that, in the solid-state imaging device 1 of FIG. 1, the adhesive section 5 is formed so as not to be positioned on the signal processing section 8. However, it may be so arranged that the adhesive section 5 entirely covers the signal processing section 8. FIG. 3 is a top view of a solid-state imaging device 10 in which the adhesive section 5 entirely covers the signal processing section 8. Also the solid-state imaging device 10 exhibits the same effect as the solid-state imaging device 1 of FIG. 1. That is, in the solid-state imaging device 1, (the entire face of) the signal processing section 8 is entirely covered by the adhesive section 5. As a result, the influence exerted by the adhesive section 5 to the signal processing section 8 is not partial. That is, the adhesive section 5 entirely influences the signal processing of the signal processing section 8. Thus, it is possible to reduce noises occurring in the signal processing section 8.

Further, the shape of the adhesive section 5 is not particularly limited as long as the adhesive section 5 is formed so as not to be positioned on the signal processing section 8 or the adhesive section 5 is formed so as to entirely cover the signal processing section 8 as illustrated in FIG. 1. For example, various shapes can be set with reference to Patent Document 2.

Figure 4:
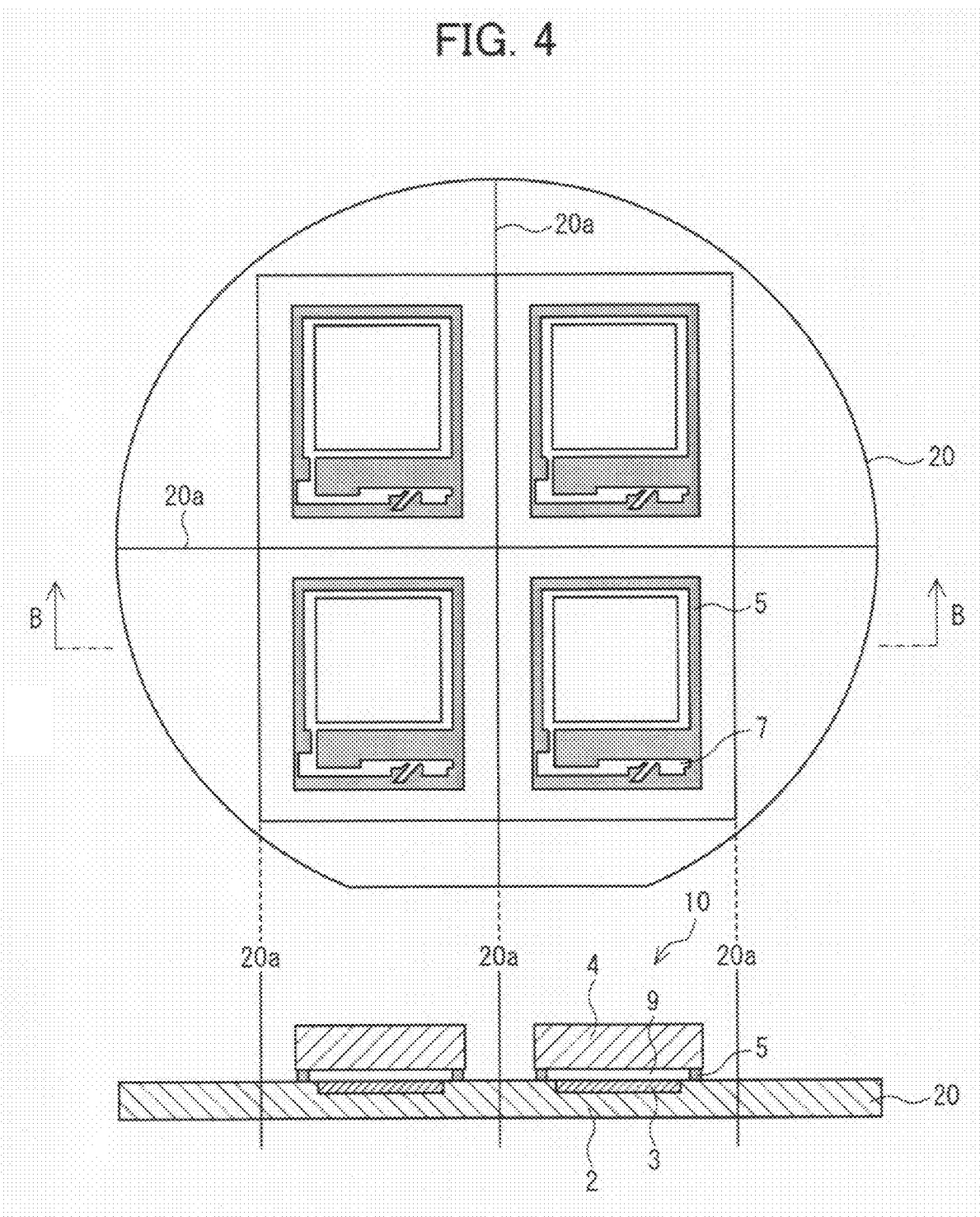
FIG. 4 is a plan view schematically illustrating a method for manufacturing the solid-state imaging device of FIG. 3.

The following describes an example of a method for manufacturing the solid-state imaging device 10. FIG. 4 illustrates a method for manufacturing a solid-state imaging device. The solid-state imaging device 10 can be manufactured as follows. A surface of the solid-state imaging element 2 is patterned in accordance with a known lithography technique so as to form the adhesive section 5, having a portion shaped as the air path 7, on each solid-state imaging element 2 of a semiconductor wafer 20, and the covering section 4 is bonded, thereby manufacturing the solid-state imaging device 10. The patterning allows a large number of adhesive sections 5 and a large number of air paths 7 to be formed on the respective solid-state imaging elements 2 of the semiconductor wafer 20 at the same time.

Specifically, an upper part of FIG. 4 illustrates a condition under which the covering section 4 having been formed on a suitable region around the effective pixel region 3 is bonded via the adhesive section 5 to the main face (plane having the effective pixel region 3) of each solid-state imaging element 2 formed on the semiconductor wafer 20. Each covering section 4 is suitably positioned in the region around the effective pixel region 3 at a single side of the solid-state imaging element 2, and then the covering section 4 is bonded by a suitable method such as irradiation of infrared ray or heat curing etc. in accordance with a property of adhesive used in the adhesive section 5.

A lower part of FIG. 4 is a cross sectional view taken along B-B of the upper part of FIG. 4. The adhesive section 5 is arranged so as to surround a periphery of the hollow section 9 formed between the effective pixel region 3 and the covering section 4, thereby preventing entrance/adhesion of dusts and scratch or the like in the effective pixel region 3 from deteriorating image quality. Further, by providing the air path 7 in the adhesion section 5, it is possible to exclude to the outside moisture having entered the hollow section 9 at the time of practical use or moisture having occurred in the hollow section 9 at the time of practical use. The bonding of the covering section 4 (formation of the adhesive section 5) is performed in a region other than the effective pixel region 3, so that the effective pixel region 3 is free from any physical stress.

The solid-state imaging element 2 to which the covering sections 4 have been bonded are suitably diced (divided) along a divisional line 20a and is separated from the semiconductor wafer 20 so as to form solid-state imaging devices 10. The solid-state imaging element 2 to which the covering section 4 has been bonded has the air path 7 which is provided in the adhesion section 5 used in the bonding so as to prevent water from entering the hollow section 9 from the outside at the time of the dicing step, so that it is possible to prevent water and foreign substance such as parings from adhering to the effective pixel region 3 as dusts, thereby preventing a surface of the effective pixel region 3 from being damaged.

Note that, the description of the solid-state imaging device 10 is an example, and the arrangement of the solid-state imaging device 10 is not limited to the description. For example, the solid-state imaging device 10 can be manufactured in the same manner as in the manufacturing method of Patent Document 2 except for the shape of the adhesive section 5.

Figure 5:
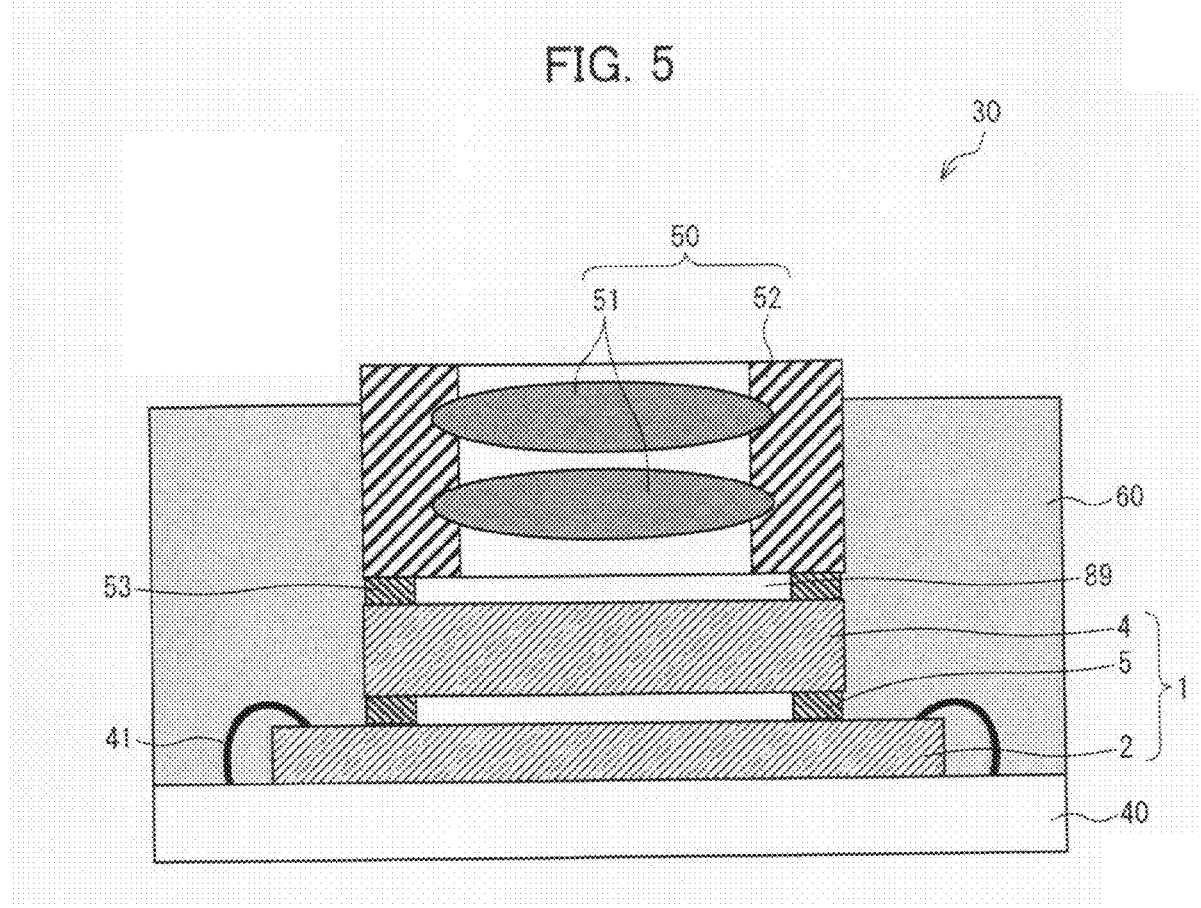
FIG. 5 is a cross sectional view schematically illustrating an arrangement of an optical device module of the present invention.

The solid-state imaging device 1 of the present embodiment can be applied as an optical device module for example. FIG. 5 is a cross sectional view schematically illustrating an optical device module of the present invention. An example of an optical device module 30 is a camera module which is arranged so that the aforementioned solid-state imaging device 1 is provided on a wiring substrate 40 and a lens unit 50 is provided via an adhesive section 53 (second adhesive section) so as to be opposite to the covering section 4. Further, the solid-state imaging device 1 and the lens unit 50 are molded with a mold resin 60. The adhesive section 53 bonds the covering section 4 and the lens unit 50 so that a hollow section (space: second hollow section) 89 is formed between the covering section 4 and the lens unit 50.

The wiring substrate 40 is constituted of a print substrate, a ceramic substrate, or the like. The lens unit 50 guides external light to the solid-state imaging element 2 and is equipped with a lens 51 and a lens holder 52 (referred to also as "housing", "optical path guide", or "lens barrel") for internally supporting the lens 51. Note that, a digital signal processor (referred to as "DSP": not shown) or the like is provided on the wiring substrate 40. Further, the solid-state imaging element 2 and the wiring substrate 40 are electrically connected to each other via a bonding wire 41.

In the optical device module 30, the solid-state imaging element 2 whose effective pixel region is protected by the covering section 4 is packaged. Thus, when manufacturing the optical device module 30, dusts do not adhere to the surface of the effective pixel region of the solid-state imaging element 2 in any step carried out after packaging the solid-state imaging element 2, so that it is possible to manufacture the optical device module 30 even under a less clean condition. Thus, it is possible to realize (i) an optical device module which can be manufactured with higher yields and simpler manufacturing steps and whose price can be made lower and (ii) a method for manufacturing the optical device module.

Figure 8:
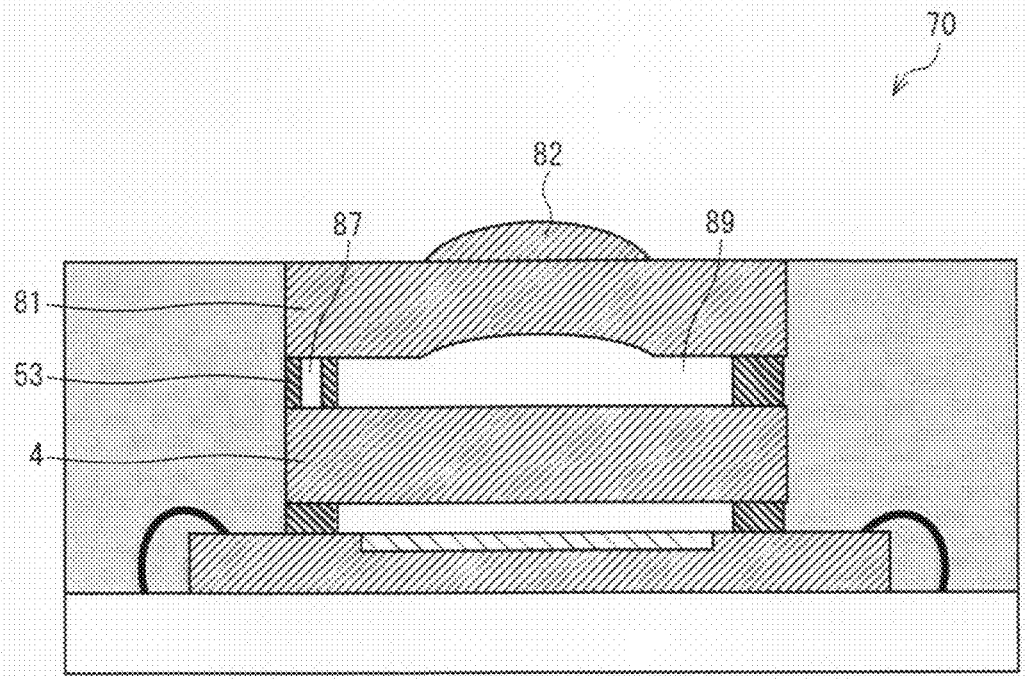
FIG. 8 is a cross sectional view schematically illustrating an arrangement of another optical device module of the present invention.
Figure 9:
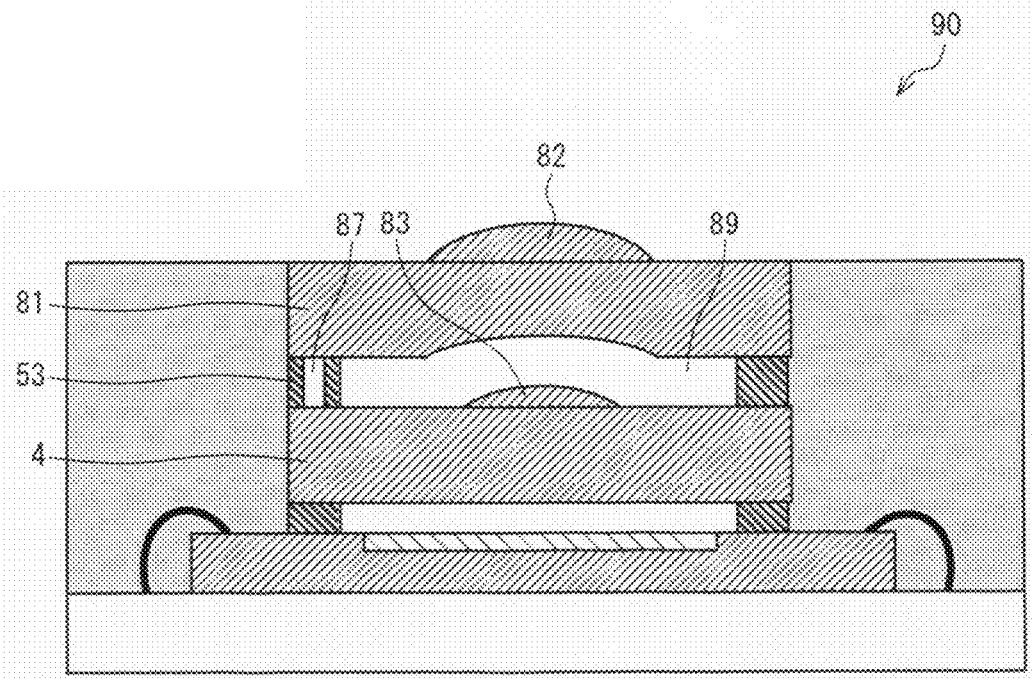
FIG. 9 is a cross sectional view schematically illustrating an arrangement of still another optical device module of the present invention.

Note that, the optical device module 30 can be arranged as in FIG. 8 and FIG. 9. FIG. 8 is a cross sectional view illustrating an optical device module 70 different from that of FIG. 5. FIG. 9 is a cross sectional view illustrating an optical device module 90 different from that of FIG. 5. Each of the optical device modules 70 and 90 does not have the lens holder 52 of FIG. 5. Specifically, in the optical device module 30 of FIG. 5, the lens 51 and the lens holder 52 supporting the lens 51 constitute the lens unit 50. On the other hand, in the optical device module 70 of FIG. 7, a transparent substrate 81 and a first lens section 82 formed on the transparent substrate 81 constitute a lens unit. Further, in the optical device module 90 of FIG. 8, the transparent substrate 81, the first lens section 82 formed on the transparent substrate 81, and a second lens section 83 formed on the covering section 4 in a convex manner constitute a lens unit. Note that, in each of the optical device modules 70 and 90, a rear surface of the transparent substrate 81 is in a concaved manner (concaved portion). In the optical device module 70, the first lens section 82 which has a convex shape and is provided on the surface of the transparent substrate 81 and the concaved portion in the rear surface allow a lens function to be exhibited. While, in the optical device module 90, the first lens section 82 which has a convex shape and is provided on the surface of the transparent substrate 81, the concaved portion in the rear surface, and the second lens section 83 which has a convex shape and is provided on the covering section 4 allow a lens function to be exhibited.

Note that, it is preferable that each of the first lens section 82 and the second lens section 83 is made of resin which makes it easier to control the molding. Further, a reflection preventing layer may be formed on the transparent substrate 81 so as to prevent ghost.

In the optical device module 70 of FIG. 8, the lens unit includes the transparent substrate 81 and the first lens section 82 formed on the transparent substrate 81 in this manner, so that the first lens section 82 can be formed on the transparent substrate 81 in accordance with wafer process. Thus, it is possible to easily set an optical distance between the effective pixel region (photo acceptance face) of the solid-state imaging element 2 and the first lens section 82 with high accuracy, and mass production can be realized. Further, in the optical device module 80, the second lens section 83 is not formed on the covering section 4, so that the surface of the covering section 4 is flat. If the surface of the covering section 4 is flat, it is unnecessary to adjust optical axes of the covering section 4 and the first lens section 82 as long as the covering section 4 is appropriately positioned so as to correspond to the solid-state imaging element 2.

On the other hand, in addition to the arrangement of the optical device module 70 of FIG. 8, the optical device module 90 of FIG. 9 is arranged so that the lens unit has the second lens section 83 formed on the covering section 4. Further, the first lens section 82, the second lens section 83, and the concaved portion in the rear surface of the transparent substrate 81 allow the lens function to be exhibited. As a result, an optical distance between the effective pixel region (photo acceptance face) 3 of the solid-state imaging element 2 and the first lens section 82 can be made shorter than that of the optical device module 70 of FIG. 8. Thus, the optical device module 90 can be made thinner. Further, the covering section 4 and the second lens section 83 can be integrally formed, so that it is possible to adjust optical axes of the covering section 4 and the second lens section 83 at the same time as in appropriately positioning the covering section 4 so as to correspond to the solid-state imaging element 2.

In each of the optical device module 70 of FIG. 8 and the optical device module 90 of FIG. 9, the adhesive section 53 bonds the covering section 4 and the transparent substrate 81 so that the hollow section (space: second hollow section) 89 is formed between the covering section 4 and the transparent substrate 81. Thus, condensation may occur also between the covering section 4 and the transparent substrate 81.

Thus, in each of the optical device module 70 of FIG. 8 and the optical device module 90 of FIG. 9, an air path 87 extending from the hollow section 89 to the outside is formed in the adhesive section 53. That is, the adhesive section 53 plays (i) a role for bonding the covering section 4 and the transparent substrate 81 and (ii) a role for forming the air path 87 extending from the hollow section 89. If the air path 87 extending from the hollow section 89 to the outside is formed in this manner, it is possible to prevent occurrence of condensation in the hollow section 89. Thus, it is possible to effectively prevent water and foreign substance from entering the hollow section 89 via the air path 87.

Figure 10:
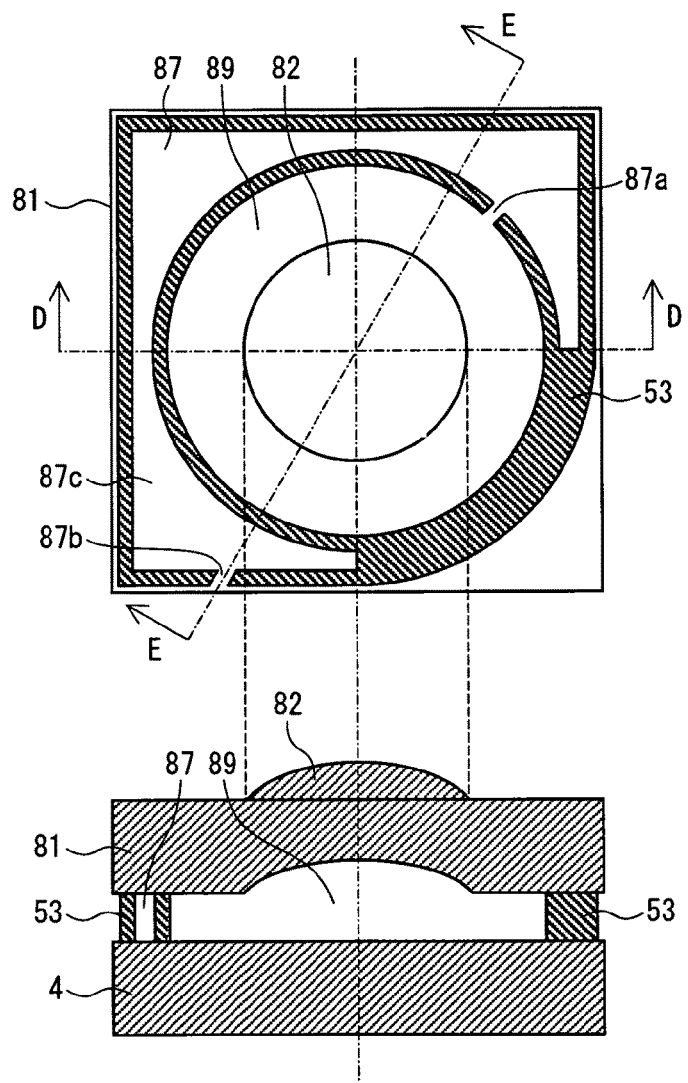
FIG. 10 is a diagram illustrating an arrangement of an adhesive section and an air path of the optical device module of FIG. 8.
Figure 11:
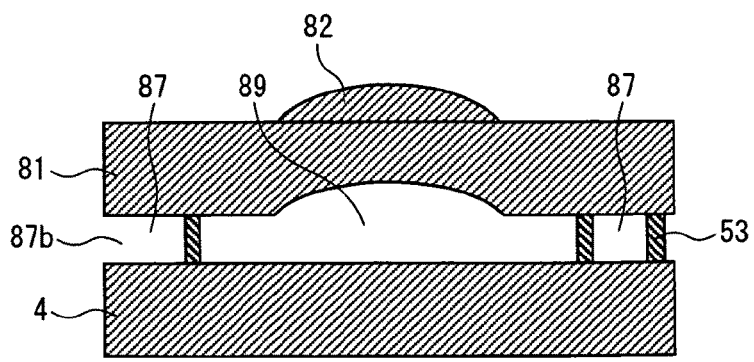
FIG. 11 is a cross sectional view taken along E-E of the arrangement illustrated in FIG. 10.
Figure 12:
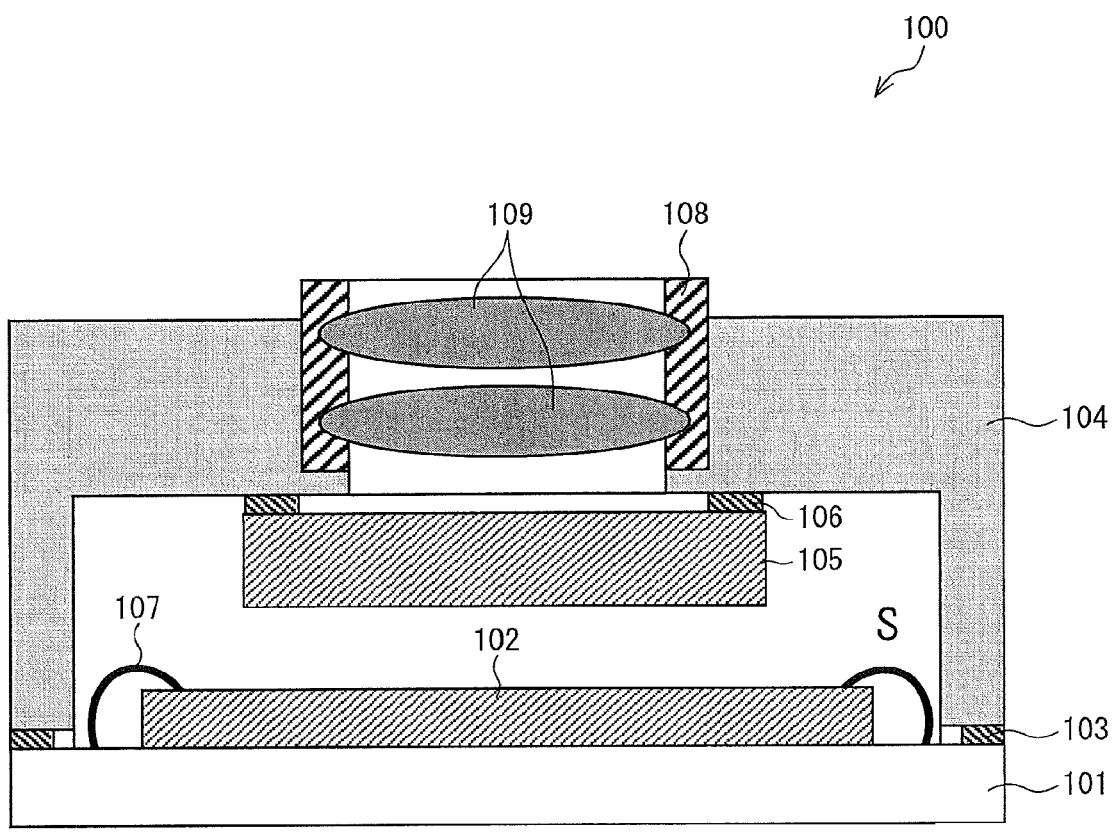
FIG. 12 is a cross sectional view schematically illustrating an arrangement of a conventional solid-state imaging device.
Figure 13:
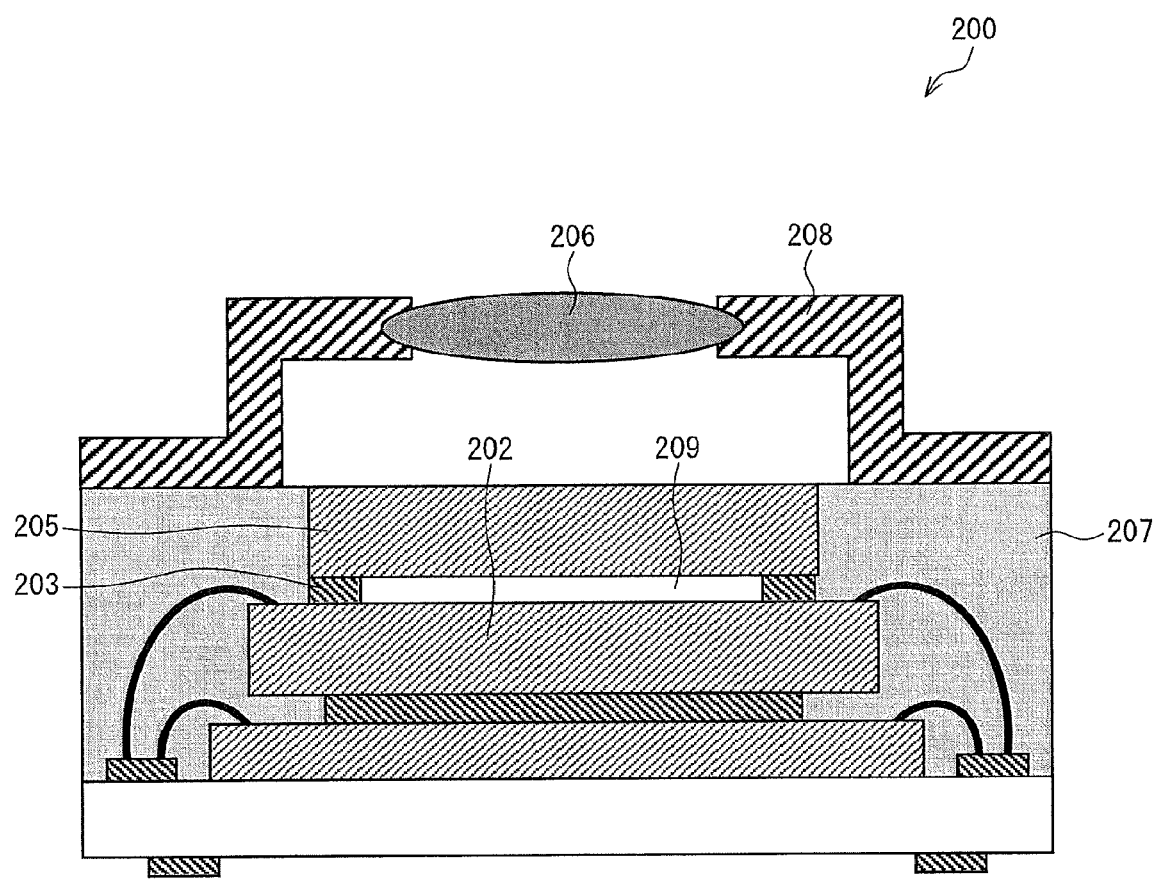
FIG. 13 is a cross sectional view of a solid-state imaging device of Patent Document 1.

FIG. 10 is a diagram illustrating an arrangement of the adhesive section 53 and the air path 87 in the optical device module 70 of FIG. 8. FIG. 11 is a cross sectional view taken along E-E of FIG. 10. Note that, an upper portion of FIG. 10 is a diagram illustrating a rear face of the transparent substrate 81.

As illustrated in FIG. 10 and FIG. 11, the optical device module 70 is arranged so that the air path 87 includes: a third opening end 87a extending to the hollow section 89; a fourth opening end 87b extending to the outside; and a catcher (second catcher) 87c which is provided between the third opening end 87a and the fourth opening end 87b so as to catch water. In this manner, the third opening end 87a of the air path 87 is provided on the adhesive section 53 so as to be positioned on the side of the hollow section 89, and the fourth opening end 87b of the air path 87 is provided on the adhesive section 53 so as to be positioned outside, and the catcher 87c for catching water existing in the air path 87 is provided between the third opening end 87a and the fourth opening end 87b which are provided on the air path 87. Thus, even if water or water and a foreign substance enter from the outside via the fourth opening end 87b in any production step carried out after a dicing step, the catcher 87c can catch (keep) the water and the foreign substance.

Note that, it is preferable that a size of the second catcher 87c is larger than a size of the third opening end 87a. This makes it possible to prevent water and foreign substance having been caught by the second catcher 87c from entering the hollow section 89 via the third opening end 87a. Thus, it is possible to prevent the foreign substance from adhering to the surface of the covering section 4 and to prevent the surface of the covering section 4 from being damaged.

Note that, the shapes of the air path 87 and the second catcher 87c of FIG. 10 are an example, and the shapes are not particularly limited. Further, also in the optical device module 90 of FIG. 9 which is arranged so that the second lens section 83 is formed on the covering section 4, the air path 87 can be formed in the same manner.

Further, the optical device module 70 can be manufactured as follows for example. Herein, an example where a single plate is diced so as to form a plurality of transparent substrates 81 is described as follows. First, a plurality of first lens sections 82 each of which has a convex shape are formed on (a surface of) a transparent plate such as glass, plastic, or the like, by molding means using material such as resin or the like, with equal intervals therebetween. While, concaved portions are formed on a rear face of the plate by molding means. As a result, the plate is such that the first lens section 82 is formed on each of the plural transparent substrates 81. Note that, shapes of the first lens section 82 and the concaved portion are set in accordance with necessary optical properties and may be spherical or aspheric.

Next, on the rear face of the plate, the adhesive section 53 made of UV cure resin is formed by patterning so as to have the air path 87 as in FIG. 10. Further, the plate is bonded, with the adhesive section 53, to the covering section 4 formed on the semiconductor wafer 20 as in FIG. 4 in accordance with necessary optical properties. The bonding is carried out under such condition that optical axes of the first lens section 82 and the solid-state imaging element 2 are adjusted and the covering section 4 and the plate are positioned with high accuracy.

Next, the plate is diced into respective transparent substrates 81 so as to form the transparent substrates 81 respectively corresponding to the solid-state imaging elements 2 on the semiconductor wafer 20. When the semiconductor wafer 20 is diced under this condition, the optical device module 70 is formed. If a plurality of transparent substrates 81 are formed from a single plate in this manner, it is possible to simplify formation of the transparent substrates 81.

Note that, in FIG. 4, the covering section 4 is bonded to each solid-state imaging element 2 on the semiconductor wafer 20. However, it may be so arranged that the covering section 4 is bonded to the semiconductor wafer 20 before bonding the covering section 4 to the solid-state imaging element 2 and after bonding the transparent substrate 81 to the covering section 4.

In the optical device module 70, the air path 87 is formed in the adhesive section 53. Thus, even in case where water enters the air path 87 in the dicing step, the catcher 87c can catch water. Thus, it is possible to prevent water having entered the air path 87 in the dicing step from reaching the hollow section 89 (on the optical path). As a result, it is possible to prevent water or foreign substance having entered the optical path from deteriorating image quality.

Note that, the present embodiment uses the solid-state imaging element as an example of a semiconductor element and uses the solid-state imaging device as an example of a semiconductor device. However, instead of the solid-state imaging device, a semiconductor laser device which uses a semiconductor laser element as a semiconductor element and converts an electric input into light may be applied as a semiconductor device. Further, instead of the transparent covering section 4, a covering section made of material which is not transparent may be used.

As described above, the semiconductor device of the present invention is arranged so that the first air path has a shielding section which is provided on a portion exposed from the covering section so as to shield the first air path. Thus, it is possible to effectively prevent water or foreign substance from entering via the first air path.

It is preferable to arrange the semiconductor device of the present invention so that the shielding section is formed on a side face of the first adhesive section.

According to the arrangement, the shielding section is formed on the side face of the first adhesive section which side face is most likely to allow water and foreign substance to enter therefrom. Thus, it is possible to more effectively prevent water and foreign substance from entering to the first hollow section via the first air path.

It is preferable to arrange the semiconductor device of the present invention so that the shielding section is a part of the first adhesive section.

According to the arrangement, the shielding section is a part of the first adhesive section, so that the shielding section can be formed at the same time as formation of the first adhesive section. Thus, it is possible to simplify formation of the shielding section.

It is preferable to arrange the semiconductor device of the present invention so as to include a signal processing section for processing a signal of the semiconductor element, wherein the first adhesive section is formed so as to entirely cover the signal processing section.

According to the arrangement, (the entire area of) the signal processing section is entirely covered by the first adhesive section. Thus, the first adhesive section does not partially influence the signal processing section. That is, the adhesive section entirely influences the signal processing of the signal processing section. Thus, it is possible to reduce noises occurring in the signal processing section. That is, it is possible to reduce noises occurring in the signal processing section for processing a signal of the semiconductor element while preventing occurrence of condensation in the covering section.

The semiconductor device of the present invention is characterized in by including a signal processing section for processing a signal of the semiconductor element, wherein the first adhesive section is formed so as not to be positioned on the signal processing section.

According to the arrangement, the air path can occupy a larger area than that in case where (the entire area of) the signal processing section is entirely covered, so that it is possible to more effectively prevent occurrence of condensation. Further, it is possible to reduce an amount of the adhesive of the first adhesive section used.

Moreover, according to the arrangement, the first adhesive section is formed so as not to be positioned on the signal processing section. That is, the entire area of the signal processing section is free from any first adhesive section. As a result, the first adhesive section does not influence the signal processing of the signal processing section. Thus, it is possible to reduce noises occurring in the signal processing section. That is, it is possible to reduce noises occurring in the signal processing section for processing a signal of the semiconductor element while preventing occurrence of condensation in the covering section.

It is preferable to arrange the semiconductor device of the present invention so that the signal processing section is an analog signal circuit section.

According to the arrangement, the adhesive section is formed so as to entirely cover the analog signal circuit section particularly susceptible to effect of noises or so as not to be positioned on the analog signal circuit section. Thus, it is possible to reduce noises of the analog signal circuit section in which noises are likely to occur.

The semiconductor device of the present invention may be arranged so that: the covering section is transparent, and the semiconductor element is a solid-state imaging element having an effective pixel region in which a plurality of photo acceptance elements for converting light transmitted through the covering section into an electric signal are disposed, and the first adhesive section is formed so as not to be positioned on the effective pixel region.

According to the arrangement, the semiconductor element is a solid-state imaging element which handles an optical signal, e.g., a CCD image sensor or a CMOS image sensor. Thus, the semiconductor device of the present invention is applicable as a solid-state imaging device.

Moreover, according to the foregoing arrangement, the first adhesive section is formed so as not to be positioned on the effective pixel region. That is, the first adhesive section is formed on a region which does not shield an optical path between the covering section and the effective pixel region. Thus, it is possible to form the first adhesive section and the first air path without dropping a photo acceptance efficiency for an optical signal.

The semiconductor device of the present invention is particularly favorable in case where the signal processing section is an amplification circuit section for amplifying an electric signal obtained by conversion with the photo acceptance elements.

In case where the semiconductor device of the present invention is a solid-state imaging device, the amplification circuit section is particularly susceptible to effect of noises. According to the arrangement, the first adhesive section is formed so as to entirely cover the analog signal circuit section or so as not to be positioned on the analog signal circuit section. Thus, it is possible to reduce noises of the analog signal circuit section which is particularly susceptible to effect of noises in the solid-state imaging device. Note that, it is favorable that the amplification circuit section processes an analog signal which is particularly susceptible to effect of noises.

It is preferable to arrange the semiconductor device of the present invention so that the first air path includes: a first opening end extending to the first hollow section; a second opening end extending to the outside; and a first catcher which is provided between the first opening end and the second opening end so as to catch water.

According to the arrangement, the first opening end of the first air path is provided on the side of the first hollow section of the first adhesive section and the second opening end of the first air path is provided on the outside of the first adhesive section, and the first catcher for catching water from the first air path is provided between the first opening end and the second opening end. Thus, even if water or water and foreign substance enter from the outside via the second opening end in any production step after the dicing step, the first catcher can catch (keep) the water and foreign substance.

Note that, it is preferable that a shape of the first catcher is larger than a shape of the first opening end. This makes it possible to prevent the water and foreign substance having been caught by the first catcher from entering the hollow section via the first opening end. Thus, it is possible to prevent adhesion of the foreign substance and occurrence of scratch on a main face of the semiconductor element.

It is preferable to arrange the semiconductor device of the present invention: the first adhesive section has a cyclic-square shape, and the first air path is formed along at least one side of the first adhesive section.

According to the arrangement, the first adhesive section has a cyclic-square shape in a plan view, so that a layout of the first adhesive section can be easily designed. Moreover, the first air path is formed along at least one side of the first adhesive section, so that a region for forming the first air path (or the catcher) can be easily reserved.

Note that, the first air path can be formed so as to correspond to each of plural sides of the first adhesive section or so as to cover the plural sides. However, in order to make the semiconductor device smaller, it is preferable to form the first air path along only one side of the first adhesive section.

An optical device module of the present invention includes the semiconductor device of the present invention and a lens unit for guiding external light to the semiconductor element, wherein: the covering section is transparent, and the semiconductor element is a solid-state imaging element having an effective pixel region in which a plurality of photo acceptance elements for converting light transmitted through the covering section into an electric signal are disposed, and the first adhesive section is formed so as not to be positioned on the effective pixel region.

According to the arrangement, the optical device module internally includes the solid-state imaging device which is one embodiment of the semiconductor device of the present invention, so that it is possible to realize the optical device module which can effectively prevent water or foreign substance from entering via the first air path.

It is preferable to arrange the optical device module of the present invention so that: the semiconductor device includes a second adhesive section which is provided on the covering section so as to be positioned on a rear face of a face where the first adhesive section is formed and which bonds the covering section and the lens unit, and a second hollow section is formed between the covering section and the lens unit, and the second adhesive section has a second air path extending from the second hollow section to the outside.

According to the arrangement, the second air path extending from the second hollow section to the outside is formed, so that it is possible to prevent occurrence of condensation in the lens unit or the covering section (condensation in the second hollow section). Thus, it is possible to effectively prevent water and foreign substance from entering the second hollow section via the second air path.

It is preferable to arrange the optical device module of the present invention so that the second air path includes: a third opening end extending to the second hollow section; a fourth opening end extending to the outside; and a second catcher which is provided between the third opening end and the fourth opening end so as to catch water.

According to the arrangement, the second opening end of the second air path is provided on the side of the second hollow section of the second adhesive section and the fourth opening end of the second air path is provided on the outside of the second adhesive section, and the second catcher for catching water from the second air path is provided between the third opening end and the fourth opening end. Thus, even if water or water and foreign substance enter from the outside via the third opening end in any production step after the dicing step, the second catcher can catch (keep) the water and foreign substance.

It is preferable to arrange the optical device module of the present invention so that the lens unit includes a transparent substrate and a first lens section formed on the transparent substrate.

According to the arrangement, the lens unit includes a transparent substrate and a first lens section formed on the transparent substrate, so that the first lens section can be formed on the transparent substrate in accordance with wafer process. Thus, it is possible to easily set an optical distance between the effective pixel region (photo acceptance face) of the solid-state imaging element and the first lens section with high accuracy, and mass production can be realized.

It is preferable to arrange the optical device module of the present invention so that the lens unit further includes a second lens section formed on the covering section.

According to the arrangement, the lens unit includes a second lens section formed on the covering section, and the first lens section and the second lens section allow the lens function to be exhibited. As a result, an optical distance between the effective pixel region (photo acceptance face) of the solid-state imaging element and the first lens section can be made shorter than that of the case where the second lens section is not provided. Thus, it is possible to provide a thinner optical device module.

The semiconductor device of the present invention can be favorably used as a solid-state imaging device installed on an optical device such as a camera, a video recorder camera, or the like, for example.

The present invention is not limited to the description of the embodiments above, but may be altered by a skilled person within the scope of the claims. An embodiment based on a proper combination of technical means disclosed in different embodiments is encompassed in the technical scope of the present invention.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A semiconductor device, comprising:
    a semiconductor element;
    a covering section for covering the semiconductor element; and a first adhesive section for bonding the semiconductor element and the covering section, wherein:

a first hollow section is formed between the semiconductor element and the covering section, and the first adhesive section has a first air path extending from the first hollow section to the outside, and the first air path has a shielding section which is provided on a portion of the first adhesive section exposed from the covering section so as to shield the first air path.

2. The semiconductor device as set forth in claim 1, wherein the shielding section is formed on a side face of the first adhesive section.

3. The semiconductor device as set forth in claim 1, wherein the shielding section is a part of the first adhesive section.

4. The semiconductor device as set forth in claim 1, comprising a signal processing section for processing a signal of the semiconductor element, wherein the first adhesive section is formed so as to entirely cover the signal processing section.

5. The semiconductor device as set forth in claim 4, wherein the signal processing section is an analog signal circuit section.

6. The semiconductor device as set forth in claim 4, wherein:

the covering section is transparent, and the semiconductor element is a solid-state imaging element having an effective pixel region in which a plurality of photo acceptance elements for converting light transmitted through the covering section into an electric signal are disposed, and the first adhesive section is formed so as not to be positioned on the effective pixel region.

7. The semiconductor device as set forth in claim 6, wherein the signal processing section is an amplification circuit section for amplifying an electric signal obtained by conversion with the photo acceptance elements.

8. The semiconductor device as set forth in claim 1, comprising a signal processing section for processing a signal of the semiconductor element, wherein the first adhesive section is formed so as not to be positioned on the signal processing section.

9. The semiconductor device as set forth in claim 1, wherein the first air path includes:

a first opening end extending to the first hollow section;

a second opening end extending to the outside; and a first catcher which is provided between the first opening end and the second opening end so as to catch water.

10. The semiconductor device as set forth in claim 1, wherein:

the first adhesive section has a cyclic-square shape, and the first air path is formed along at least one side of the first adhesive section.

11. An optical device module, comprising a semiconductor device and a lens unit, said semiconductor device comprising:

a semiconductor element;

a covering section for covering the semiconductor element; and a first adhesive section for bonding the semiconductor element and the covering section, wherein:

a first hollow section is formed between the semiconductor element and the covering section, and the first adhesive section has a first air path extending from the first hollow section to the outside, and the first air path has a shielding section which is provided on a portion of the first adhesive section exposed from the covering section so as to shield the first air path, said semiconductor device further comprising a signal processing section for processing a signal of the semiconductor element, wherein:

the first adhesive section is formed so as to entirely cover the signal processing section, and the covering section is transparent, and the semiconductor element is a solid-state imaging element having an effective pixel region in which a plurality of photo acceptance elements for converting light transmitted through the covering section into an electric signal are disposed, and the first adhesive section is formed so as not to be positioned on the effective pixel region, said lens unit guiding external light to the semiconductor element.

12. The optical device module as set forth in claim 11, wherein:

the semiconductor device includes a second adhesive section which is provided on the covering section so as to be positioned on a rear face of a face where the first adhesive section is formed and which bonds the covering section and the lens unit, and a second hollow section is formed between the covering section and the lens unit, and the second adhesive section has a second air path extending from the second hollow section to the outside.

13. The optical device module as set forth in claim 12, wherein the second air path includes:

a third opening end extending to the second hollow section;

a fourth opening end extending to the outside; and a second catcher which is provided between the third opening end and the fourth opening end so as to catch water.

14. The optical device module as set forth in claim 11, wherein the lens unit includes a transparent substrate and a first lens section formed on the transparent substrate.

15. The optical device module as set forth in claim 14, wherein the lens unit further includes a second lens section formed on the covering section.

* * * * *